US010852345B2

(12) United States Patent
Liu et al.

(10) Patent No.: US 10,852,345 B2
(45) Date of Patent: Dec. 1, 2020

(54) CIRCUIT BOARD TESTING DEVICE AND METHOD THEREOF

(71) Applicants: HONGFUJIN PRECISION ELECTRONICS (CHENGDU) Co., Ltd., Chengdu (CN); HON HAI PRECISION INDUSTRY CO., LTD., New Taipei (TW)

(72) Inventors: Qiang Liu, Chengdu (CN); Wen-Wen Zhou, Chengdu (CN); Meng Wang, Chengdu (CN); Zi-Qing Xia, Chengdu (CN); Zhi-Gao Wu, Chengdu (CN)

(73) Assignees: HONGFUJIN PRECISION ELECTRONICS (CHENGDU) Co., Ltd., Chengdu (CN); HON HAI PRECISION INDUSTRY CO., LTD., New Taipei (TW)

( * ) Notice: Subject to any disclaimer, the term of this patent is extended or adjusted under 35 U.S.C. 154(b) by 82 days.

(21) Appl. No.: 16/204,306

(22) Filed: Nov. 29, 2018

(65) Prior Publication Data

US 2020/0103461 A1 Apr. 2, 2020

(30) Foreign Application Priority Data

Sep. 30, 2018 (CN) .......................... 2018 1 1163456

(51) Int. Cl.
*G01R 31/28* (2006.01)
*H01R 12/52* (2011.01)

(52) U.S. Cl.
CPC ......... *G01R 31/2836* (2013.01); *H01R 12/52* (2013.01)

(58) Field of Classification Search
CPC ............................. H01R 12/52; G01R 31/2836
USPC ...................................................... 324/763.01
See application file for complete search history.

(56) References Cited

U.S. PATENT DOCUMENTS

| | | | | |
|---|---|---|---|---|
| 4,342,957 A | * | 8/1982 | Russell | G01R 31/50 324/72.5 |
| 4,504,783 A | * | 3/1985 | Zasio | G01R 31/31908 324/750.01 |
| 4,510,572 A | * | 4/1985 | Reece | G01R 31/31914 324/133 |
| 4,565,966 A | * | 1/1986 | Burr | G01R 31/088 324/519 |

(Continued)

FOREIGN PATENT DOCUMENTS

| | | |
|---|---|---|
| CN | 104237765 A | 12/2014 |
| TW | 200537111 A | 11/2005 |

*Primary Examiner* — Patrick Assouad
*Assistant Examiner* — Demetrius R Pretlow
(74) *Attorney, Agent, or Firm* — ScienBiziP, P.C.

(57) ABSTRACT

A circuit board testing device electrically coupled to a measurement gauge tests a circuit board. The circuit board testing device includes a processor configured to configure measurement parameters of the measurement gauge, configure measurement rules for testing the circuit board, confirm a circuit of the circuit board to be tested according to the record of test data, control the measurement gauge to test the circuit of the circuit board to be tested when the measurement gauge is electrically coupled to the circuit of the circuit board to be tested, receive measurement data returned by the measurement gauge, and analyze a faulty region of the circuit board according to the record of test data and the measurement data.

10 Claims, 6 Drawing Sheets

(56) References Cited

U.S. PATENT DOCUMENTS

| | | | | |
|---|---|---|---|---|
| 4,713,815 A * | 12/1987 | Bryan | G01R 31/3183 | |
| | | | 714/46 | |
| 5,459,396 A * | 10/1995 | Asar | G01R 31/68 | |
| | | | 324/754.1 | |
| 5,469,064 A * | 11/1995 | Kerschner | G01R 1/07 | |
| | | | 324/537 | |
| 5,521,513 A * | 5/1996 | Stringer | G01R 31/2806 | |
| | | | 324/527 | |
| 6,175,230 B1 * | 1/2001 | Hamblin | G01R 31/31915 | |
| | | | 324/73.1 | |
| 6,195,618 B1 * | 2/2001 | Rosenberg | G01B 21/04 | |
| | | | 700/109 | |
| 6,731,104 B1 * | 5/2004 | Yang | G01R 1/06772 | |
| | | | 324/110 | |
| 7,110,905 B2 * | 9/2006 | Le | G01R 31/2808 | |
| | | | 702/117 | |
| 7,847,567 B2 * | 12/2010 | Koh | G01R 31/2806 | |
| | | | 324/754.07 | |
| 2003/0115517 A1 * | 6/2003 | Rutten | G01R 31/2886 | |
| | | | 714/718 | |
| 2005/0251715 A1 | 11/2005 | Loh et al. | | |
| 2006/0097741 A1 * | 5/2006 | Payman | G01R 31/70 | |
| | | | 324/762.03 | |
| 2007/0186131 A1 * | 8/2007 | Goodrich | G01R 31/2889 | |
| | | | 714/724 | |
| 2008/0025383 A1 * | 1/2008 | Li | G01R 31/31922 | |
| | | | 375/226 | |
| 2008/0252311 A1 * | 10/2008 | Koh | G01R 31/2806 | |
| | | | 324/754.08 | |
| 2009/0267628 A1 * | 10/2009 | Takase | G01R 31/31905 | |
| | | | 324/763.01 | |
| 2010/0295552 A1 * | 11/2010 | Li | G01R 31/2808 | |
| | | | 324/537 | |
| 2011/0279138 A1 * | 11/2011 | Mutnury | G01R 31/2806 | |
| | | | 324/755.01 | |
| 2012/0066655 A1 * | 3/2012 | Chen | G06F 30/398 | |
| | | | 716/102 | |
| 2016/0054385 A1 * | 2/2016 | Suto | G01R 31/2812 | |
| | | | 324/754.1 | |
| 2016/0103172 A1 * | 4/2016 | Yamashita | G01R 31/54 | |
| | | | 324/754.07 | |
| 2016/0161548 A1 * | 6/2016 | Mikkola | G01R 31/2818 | |
| | | | 324/750.01 | |
| 2017/0315672 A1 * | 11/2017 | Takahashi | G06F 3/041 | |
| 2018/0156868 A1 * | 6/2018 | Batz | G01R 31/3172 | |

* cited by examiner

FIG. 1

| Serial port configuration ▵ | Port name ▵ |
|---|---|
| Voltage measurement configuration ▵ | Baud rate ▵ |
| Test information default selection ▵ | Data bit ▵ |
| Measurement delay configuration ▵ | Stop bit ▵ |
| Measurement configuration ▵ | Parity bit ▵ |
| Update database | Port default initiation ▵ |

- Serial port configuration ▽
- Voltage measurement configuration ▽
- Test information default selection ▽
- Measurement delay configuration ▽
- Measurement configuration ▽
- Update database

| Measurement value automatic input ▽ |
|---|
| Measurement value manual input |
| Measurement value automatic input |

CIRCUIT BOARD TESTING DEVICE AND METHOD THEREOF

FIELD

The subject matter herein generally relates to circuit boards, and more particularly to a circuit board testing device and a method for testing a circuit board.

BACKGROUND

In order to maintain normal operation of electronic devices, circuit boards of the electronic devices are required to be tested. Circuit boards have numerous electronic components. A process of testing circuit boards is generally done manually and is time-consuming.

BRIEF DESCRIPTION OF THE DRAWINGS

Implementations of the present disclosure will now be described, by way of embodiment only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

In general, the word "module" as used hereinafter refers to logic embodied in hardware or firmware, or to a collection of software instructions, written in a programming language such as, for example, Java, C, or assembly. One or more software instructions in the modules may be embedded in firmware such as in an erasable-programmable read-only memory (EPROM). It will be appreciated that the modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
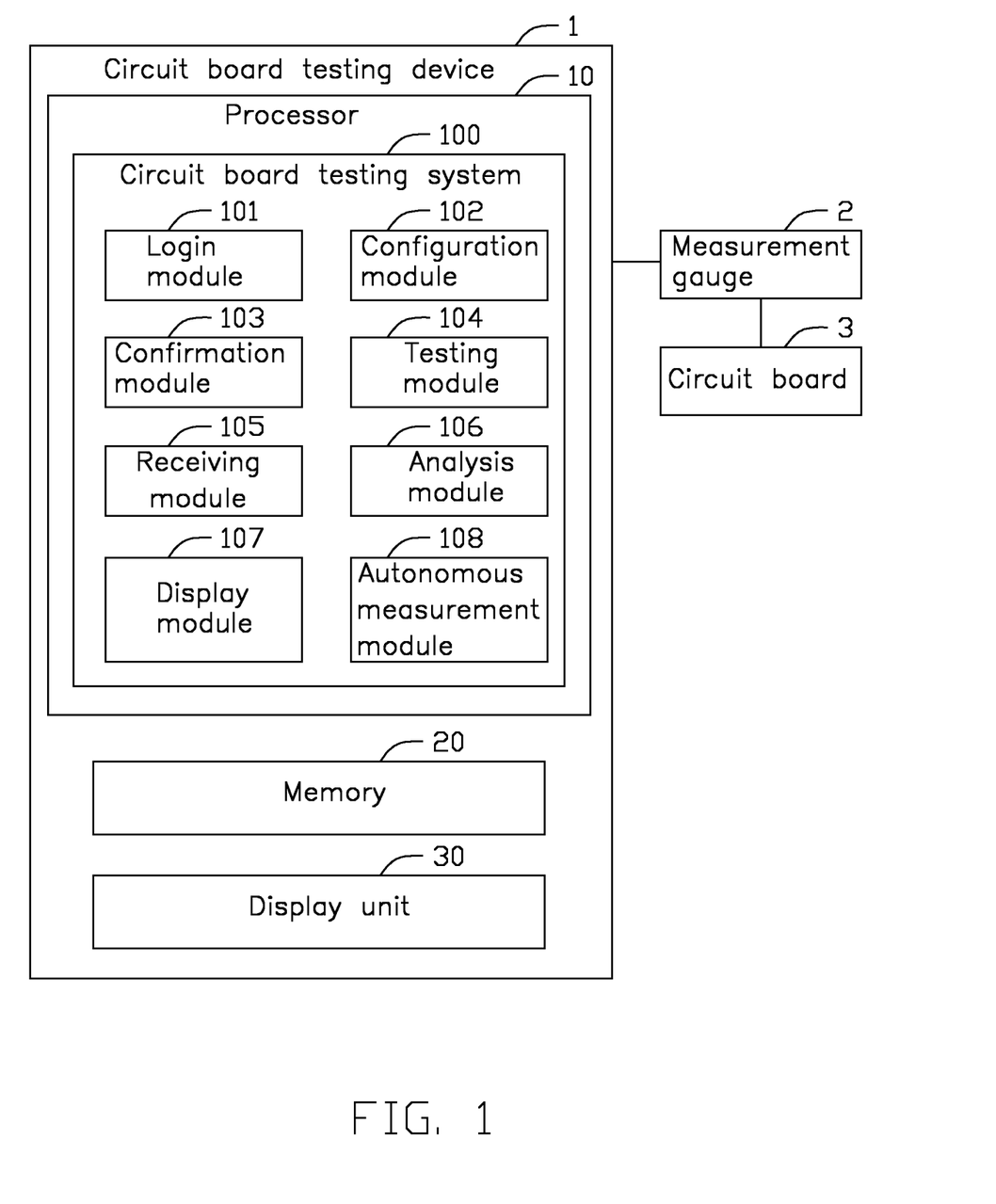
FIG. 1 is a block diagram of an embodiment of a circuit board testing device electrically coupled to a measurement gauge and a circuit board.
Figure 2:
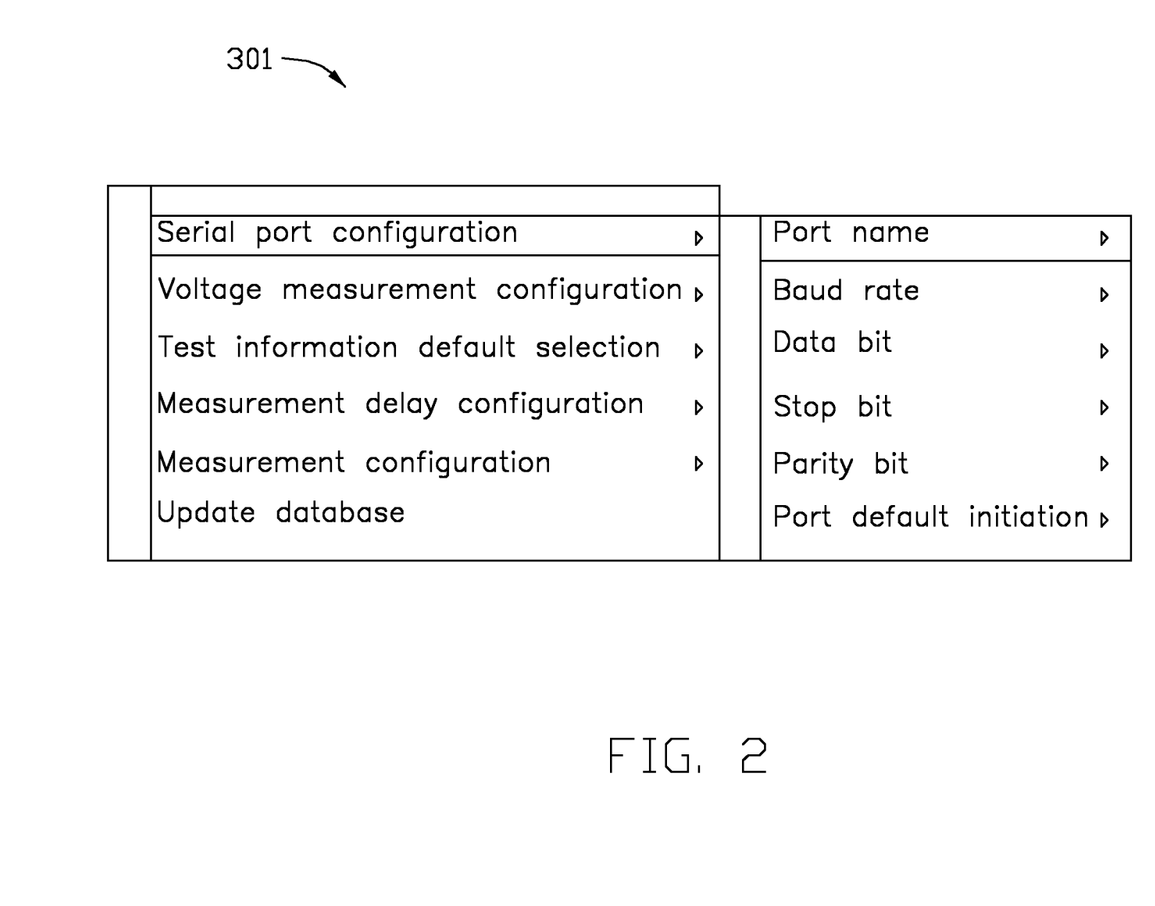
FIGS. 2-5 are diagrams of a measurement parameter settings option of an operation interface.

FIG. 1 illustrates an embodiment of a circuit board testing device 1 (hereinafter "the device 1"). The device 1 is electrically coupled to a measurement gauge 2 and is configured to test whether a circuit board 3 is faulty and a faulty region of the circuit board 3. In at least one embodiment, the device 1 is a personal computer, the measurement gauge 2 is a multimeter, and the circuit board 3 may be a motherboard or a printed circuit board.

The device 1 includes at least a processor 10, a memory 20, and a display unit 30. The memory 20 may be a read-only memory or a random access memory for storing a record of test data of the device 1 testing the circuit board 3. The display unit 30 is a display screen for displaying an operation interface of the device 1.

As illustrated in FIG. 1, the device 1 implements a circuit board testing system 100, which includes at least a login module 101, a configuration module 102, a confirmation module 103, a testing module 104, a receiving module 105, an analysis module 106, and a display module 107. The modules 101-107 can include one or more software programs in the form of computerized codes stored in the memory 20. The computerized codes can include instructions executed by the processor 10 to provide functions for the modules 101-107.

The login module 101 responds to a user login request and logs into the circuit board testing system 100.

In at least one embodiment, when a user opens the circuit board testing system 100 on the device 1, the login module 101 provides a login interface. When a user account and password input in the login interface is verified, the login module 101 controls the circuit board testing system 100 to open the operation interface. The operation interface includes a plurality of settings options.

In at least one embodiment, the circuit board testing system 100 includes at least three access privilege levels. The three access privilege levels include an administration access privilege, an operation access privilege, and an engineering access privilege. The administration access privilege allows configuration of the circuit board testing system 100, such as configuration of a circuit board testing interface, base parameters for testing the circuit board, and information security, but does not allow operation of testing the circuit board 3. The operation access privilege allows execution of preconfigured operations, such as configuration of parameters of the measurement gauge 2 and configuration of measurement rules. The engineering access privilege allows execution of testing the circuit board 3 in addition to the same privileges as the operation access privilege.

In at least one embodiment, the user account corresponds to one of the three access privilege levels. When the user account and password are input to login to the circuit board testing system 100, the login module 101 identifies the user account and confirms the corresponding access privilege level to provide corresponding configuration functions of the access privilege level.

The configuration module 102 configures, before testing of the circuit board 3 is executed, measurement parameters of the measurement gauge 2. The configuration module 102 provides a plurality of selection choices for a user to select. The selection choices provided correspond to the access privilege level of the user and the configuration functions of the corresponding operation interface. As shown in FIGS.

3-6, the settings options of the operation interface include a measurement parameter settings option 301 of the measurement gauge 2. The configuration module 102 configures the measurement gauge 2 according to the user selection of the measurement parameter settings option 301.

Figure 3:
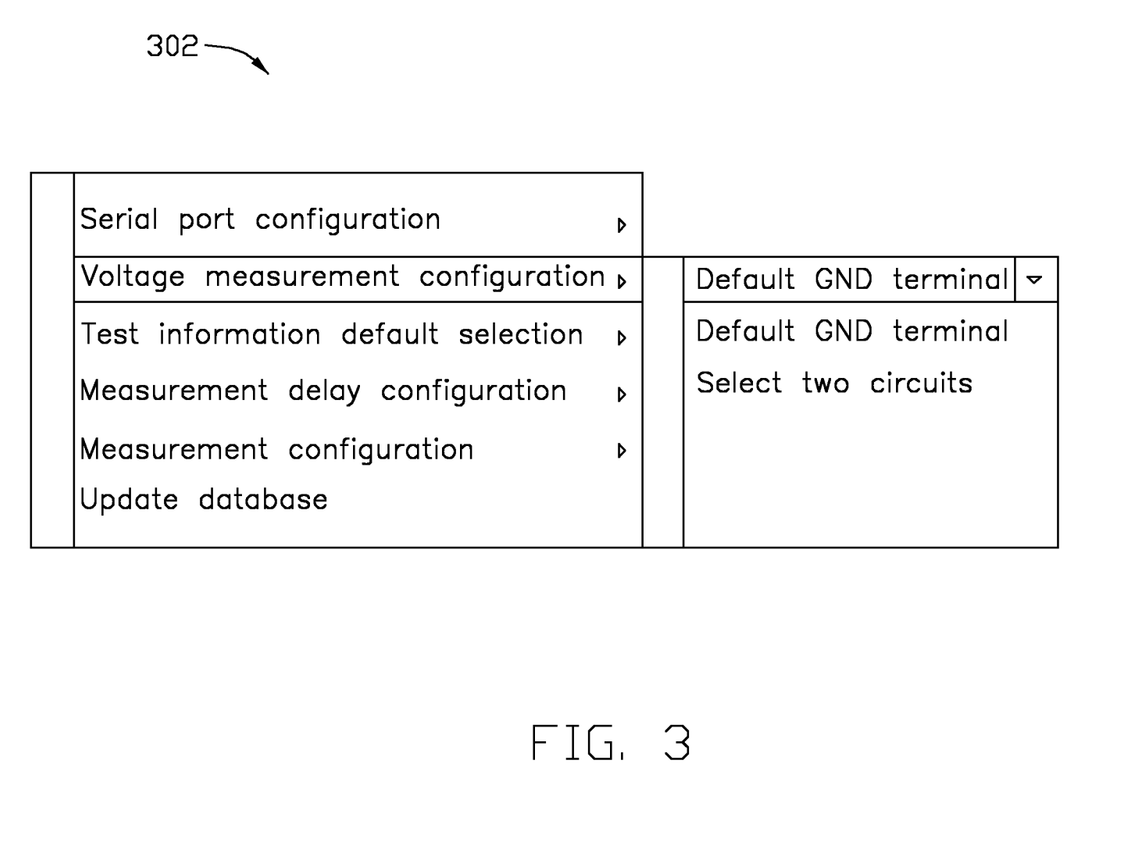
Figure 4:
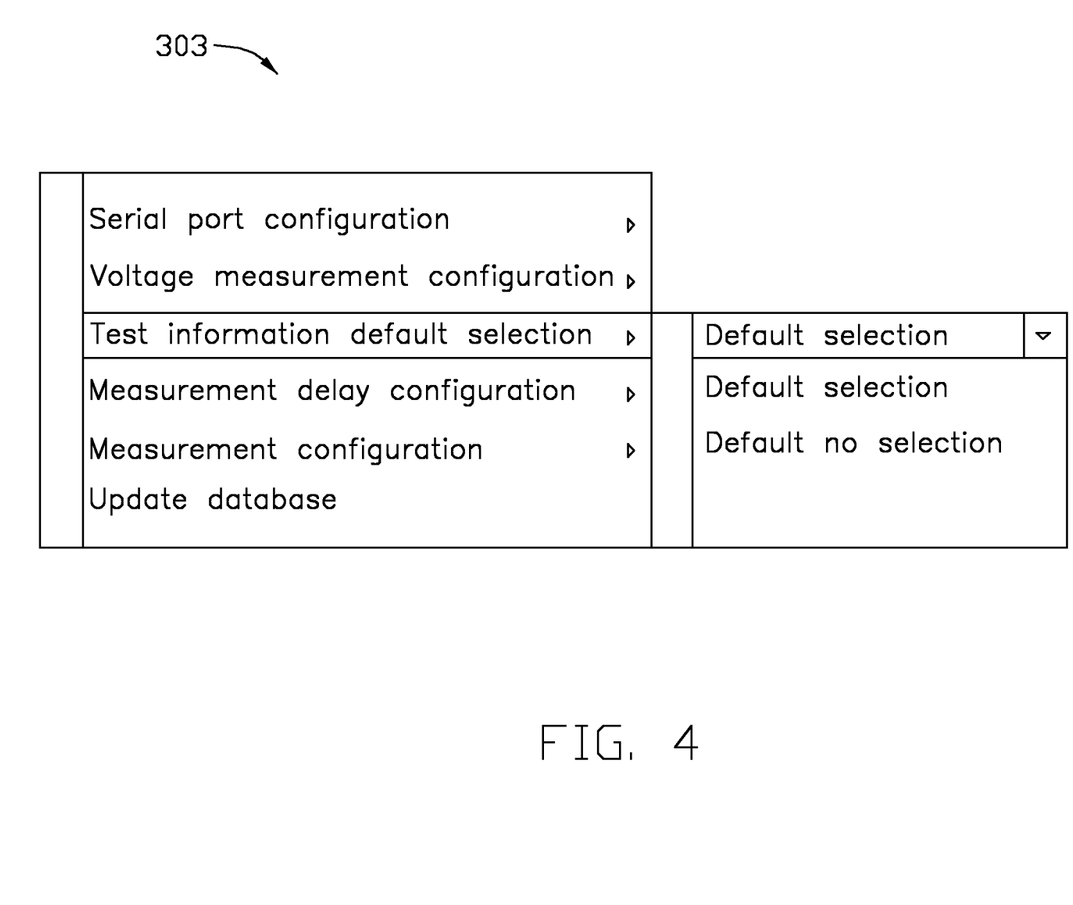

As shown in FIGS. 3-4, in at least one embodiment, the configurations of the measurement gauge 2 include at least a serial port configuration and a voltage measurement configuration. The serial port configuration includes at least a port name, a baud rate, data bits, stop bits, parity bits, and a default serial port. The measurement gauge 2 is coupled to the device 1 through a port to establish data communication. The measurement gauge 2 may be coupled to the device 1 through a USB port, and a corresponding port name is COM4. The baud rate of the measurement gauge 2 may be 9600. The data bits and a digital multimeter may be synchronously configured as 8. The stop bits and the digital multimeter may be synchronously configured as 2. The parity bits may include "none", "mark", "even", "odd", and "space" selections for a user to select one. In detail, the parity bit "none" represents no parity bit, the parity bit "mark" represents a value of 1, the parity bit "even" represents an even parity bit, the parity bit "odd" represents an odd parity bit, and the parity bit "space" represents a value of 0. The default serial port selection configures "yes" or "no" to confirm whether to use or not to use the default serial port when the circuit board testing system is initiated.

In at least one embodiment, the measurement gauge 2 measures a circuit voltage. The voltage measurement configuration is a method configuration for measuring voltage of a circuit of the circuit board 3, including measuring a voltage between a signal line and a ground terminal and a voltage between two signal lines. In another embodiment, the measurement gauge 2 further measures a circuit resistance and a circuit diode differential voltage. The user can configure the corresponding circuit resistance measurement settings and the circuit diode differential voltage settings. When the measurement gauge 2 is being configured, the series port and other external devices of the device 1 are turned off.

Figure 5:
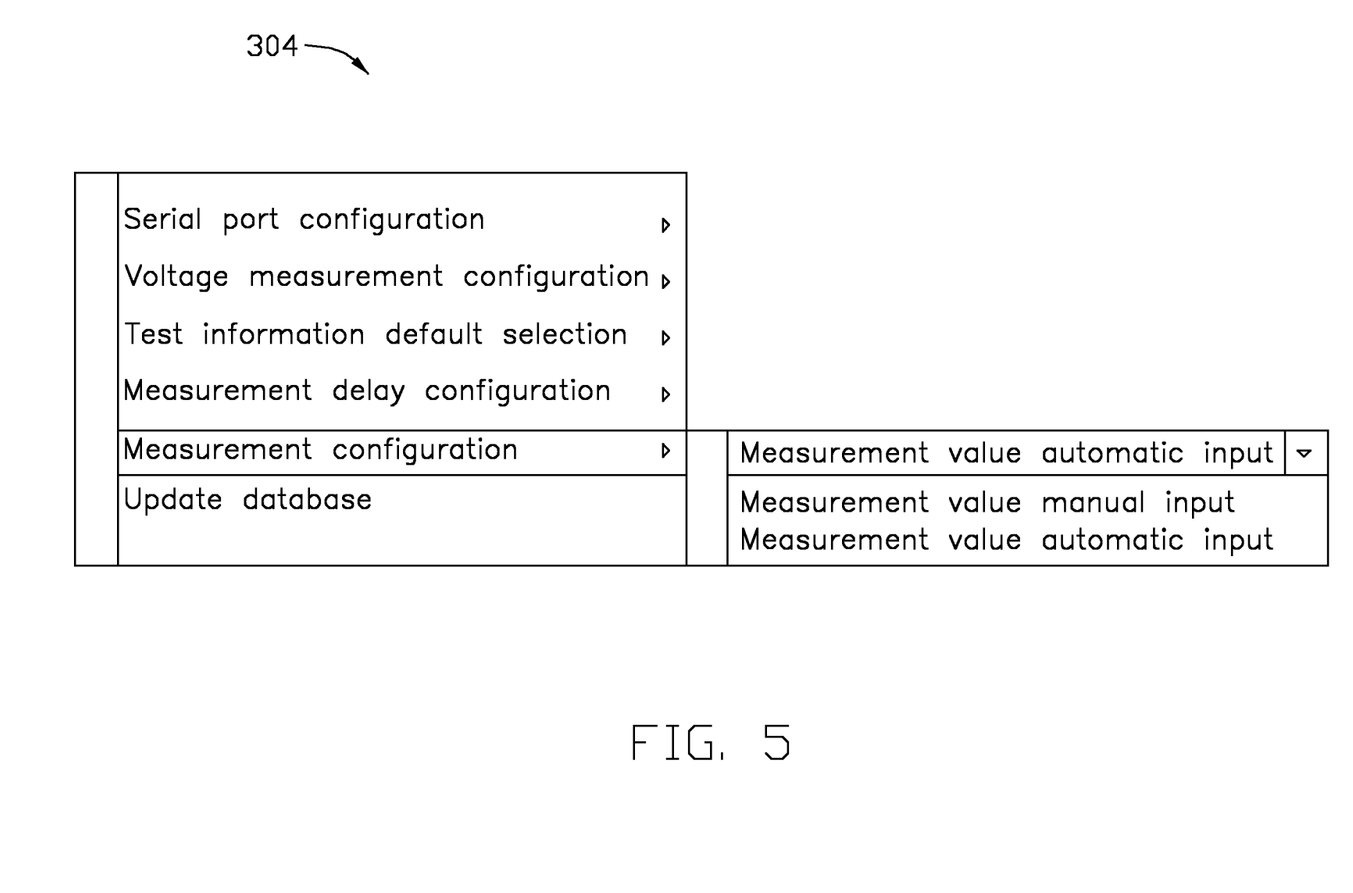
Figure 6:
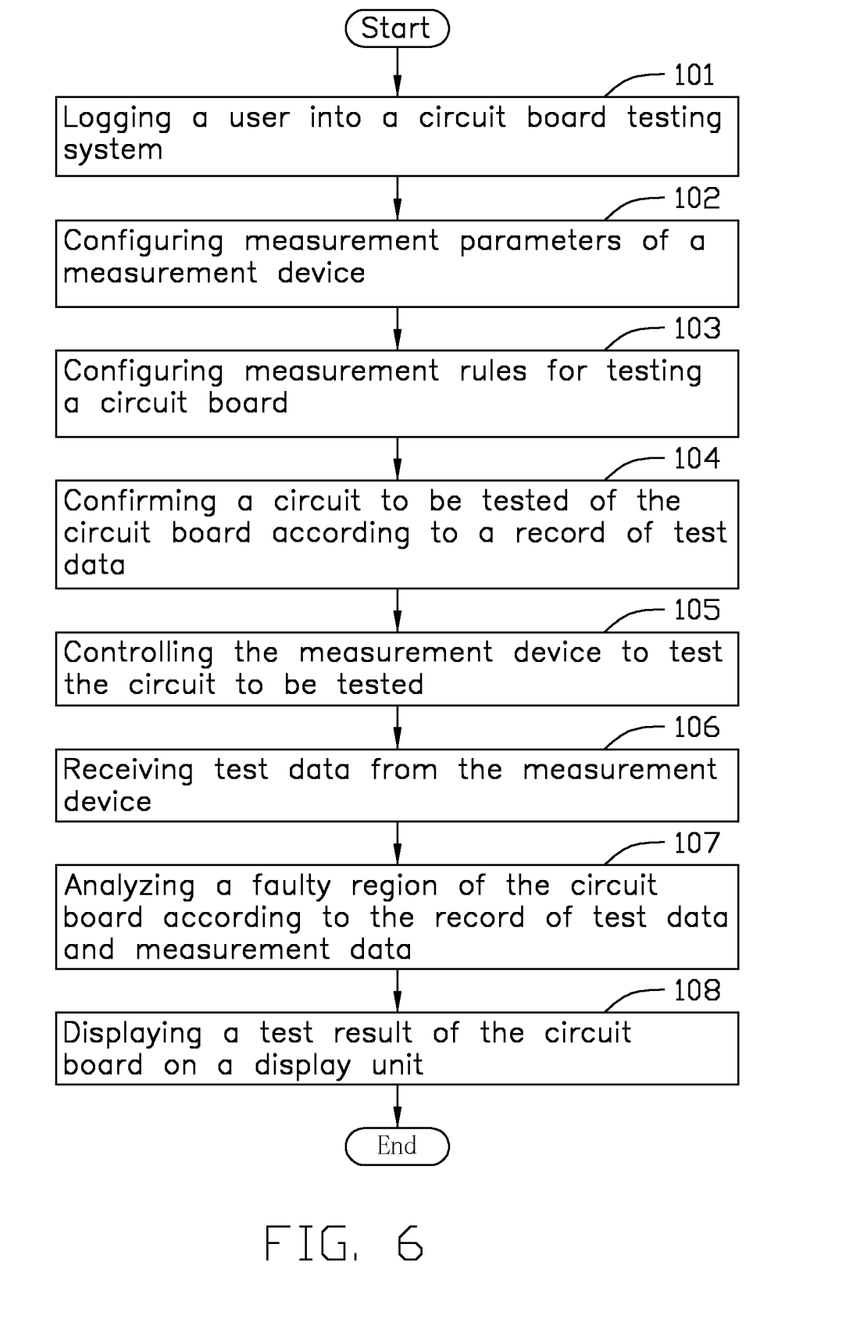
FIG. 6 is a flowchart of a method for testing a circuit board.

As shown in FIGS. 5-6, in one embodiment, the measurement parameter settings option 301 further provides measurement rule configurations. The configuration module 102 configures measurement rules for testing the circuit board 3 according to the configurations selected by the user.

In at least one embodiment, the measurement rules include at least a test information selection configuration, a measurement delay configuration, and a measurement value input method configuration. Test information of the test information selection configuration refers to a record of test data of the circuit board 3, and a user can select the test information. The measurement delay configuration refers to a time delay before the measurement gauge 2 measures the voltage. The time delay configuration may be configured according to normal use of the circuit board and lower voltage fluctuations of other electrical components before rebooting to normal operation, thereby increasing measurement accuracy. The measurement value input method includes automatic input and manual input methods. The automatic input method refers to the measurement gauge 2 automatically filling in a measurement value in a measurement value field of the operation interface. The manual input method refers to a user manually inputting the measurement value in the measurement value field of the operation interface.

The confirmation module 103 confirms circuits of the circuit board 3 to be tested according to the record of test data.

In one embodiment, when the measurement parameters of the measurement gauge 2 and the measurement rules for testing the circuit board 3 are configured, the confirmation module 103 confirms the circuits of the circuit board 3 to be tested according to the record of test data. The record of test data includes at least a plurality of circuits of the circuit board 3 tested during each time of testing the circuit board 3 and a corresponding voltage value of each circuit. In at least one embodiment, the confirmation module 103 confirms a plurality of measurement scopes and a measurement sequence of the plurality of measurement scopes according to a K-means clustering algorithm or a classification decision tree algorithm. The K-means clustering algorithm and the classification decision tree algorithm are both unsupervised machine-learning algorithms.

In detail, the confirmation module 103 obtains the record of test data stored in the memory 20. The record includes a measurement scope of each time of testing the circuit board 3 and a voltage value of each circuit of each measurement scope. The confirmation module 103 selects the circuit having a most number of times of being tested in the record of test data as the circuit to be tested.

The testing module 104 controls the measurement gauge 2 to test the circuit to be tested when the measurement gauge 2 is electrically coupled to the circuit to be tested.

In one embodiment, each circuit of the circuit board 3 corresponds to a serial number. The user finds the circuit to be tested according to the serial number and manually controls the measurement gauge 2 to electrically couple to the circuit to be tested, and then the testing module 104 sends a test signal to control the measurement gauge 2 to begin testing a voltage between two signal lines and a voltage between a signal line and a ground terminal.

The receiving module 105 receives test data from the measurement gauge 2. In at least one embodiment, the measurement gauge 2 automatically sends the test data to the device 1. The test data includes the measured voltage between the two signal lines and the measured voltage between the signal line and the ground terminal.

The analysis module 106 analyzes a faulty region of the circuit board 3 according to the record of test data and the measurement data.

In one embodiment, the analysis module 106 uses a K-means clustering algorithm or a class decision tree algorithm to determine the faulty region of the circuit board 3. The K-means clustering algorithm and the class decision tree algorithm are unsupervised machine-learning algorithms.

In one embodiment, the analysis module 106 obtains from the memory 20 the record of test data of the circuit board 3 including the record of voltage measurement values of the circuits to be tested. The analysis module 106 performs K-means clustering on the recorded voltage measurement values to generate K measurement ranges. Each time the measurement gauge 2 completes a voltage measurement, the analysis module 106 selects a K measurement range including the voltage measurement and confirms a recorded voltage measurement value within the K measurement range as a reference value, and then the testing module 104 controls the measurement gauge 2 to measure the voltage of the next circuit to be tested to determine the faulty region of the circuit board 3.

The confirmation module 103 updates the record of test data after each time of testing a circuit to be tested. After each circuit is tested, a next circuit having a most number of times of being tested is confirmed as the circuit to be tested until the faulty region of the circuit board 3 is determined or until there are no more circuits left to be tested.

The display module 107 displays on the display unit 30 a test result of the circuit board 3.

In at least one embodiment, the display unit 30 displays the operation interface of the circuit board testing system 100. The operation interface displays corresponding configuration selections, a toolbar, a data display box, and the like. When the analysis module 106 determines the test result, the analysis module 106 displays the test result in a corresponding position of the operation interface. The test result includes at least the faulty region of the circuit board 3 and the voltage measurement value of the faulty circuit.

The circuit board testing system 100 further includes an autonomous measurement module 108. When a ratio of bad data of the record of test data is less than a first predetermined ratio or when a ratio of faulty components needing to be replaced is less than a second predetermined ratio, the autonomous measurement module 108 confirms the circuit to be tested according to user input. In one embodiment, the first predetermined ration is 5%, and the second predetermined ratio is 80%. The operation interface includes an autonomous measurement selection and a circuit to be tested input field. A user can select the autonomous measurement selection and manually input the serial number of the circuit to be tested to confirm the circuit to be tested.

FIG. 7 illustrates a flowchart of an embodiment for testing a circuit board. The embodiment is provided by way of example, as there are a variety of ways to carry out the method. The method described below can be carried out using the configurations illustrated in FIGS. 1-6, for example, and various elements of these figures are referenced in explaining the example method. Each block shown in FIG. 7 represents one or more processes, methods, or subroutines carried out in the example method. Furthermore, the illustrated order of blocks is by example only, and the order of the blocks can be changed. Additional blocks can be added or fewer blocks can be utilized, without departing from this disclosure.

At block S101, a user is logged into the circuit board testing system 100 in response to a user login request. In at least one embodiment, when an account name and password of the user input into a login interface is verified, the circuit board testing system 100 is initiated.

At block S102, measurement parameters of the measurement gauge 2 are configured before testing of the circuit board 3 is executed. In at least one embodiment, the configurations of the measurement gauge 2 include at least a serial port configuration and a voltage measurement configuration.

At block S103, measurement rules for testing the circuit board 3 are configured. Configuration of the measurement rules includes at least a test information selection configuration, a measurement delay configuration, and a measurement value input method configuration.

At block S104, a circuit to be tested of the circuit board 3 is confirmed according to a record of test data of the circuit board 3.

At block S105, the measurement gauge 2 is controlled to test the circuit to be tested. In at least one embodiment, the measurement gauge 2 measures a voltage between two signal lines of the circuit and a voltage between a signal line and a ground terminal.

At block S106, test data is received from the measurement gauge 2. In at least one embodiment, the measurement gauge 2 automatically sends the test data to the device 1.

At block S107, a faulty region of the circuit board 3 is analyzed according to the record of test data and the measurement data.

In one embodiment, the record of test data of the circuit board 3 including the record of voltage measurement values of the circuits to be tested is obtained from the memory 20. A K-means clustering algorithm is performed on the recorded voltage measurement values to generate K measurement ranges. Each time the measurement gauge 2 completes a voltage measurement, a K measurement range including the voltage measurement is selected and a recorded voltage measurement value within the K measurement range is confirmed as a reference value, and then the measurement gauge 2 is controlled to measure the voltage of the next circuit to be tested until the faulty region of the circuit board 3 is determined.

The record of test data is updated after each time of testing a circuit to be tested. After each circuit is tested, a next circuit having a most number of times of being tested is confirmed as the circuit to be tested until the faulty region of the circuit board 3 is determined or until there are no more circuits left to be tested.

At block S108, the test result of the circuit board 3 is displayed on the display unit 30. The test result includes at least the faulty region of the circuit board 3 and the voltage measurement value of the faulty circuit.

Furthermore, when a ratio of bad data of the record of test data is less than a first predetermined ratio or when a ratio of faulty components needing to be replaced is less than a second predetermined ratio, the circuit to be tested is confirmed according to user input.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board testing device electrically coupled to a measurement gauge and adapted for testing a circuit board, the circuit board testing device comprising a processor and a memory, the memory storing a record of test data of the circuit board testing device testing the circuit board, the processor configured to:
   configure, before testing the circuit board, measurement parameters of the measurement gauge;
   configure measurement rules for testing the circuit board;
   confirm a circuit of the circuit board to be tested according to the record of test data;
   control the measurement gauge to test the circuit of the circuit board to be tested when the measurement gauge is electrically coupled to the circuit of the circuit board to be tested;
   receive measurement data from the measurement gauge; and
   analyze a faulty region of the circuit board according to the record of test data and the measurement data;
   wherein the record of test data comprises at least a plurality of circuits of the circuit board tested during each time of testing the circuit board and a corresponding voltage value of each circuit of the circuit board;
the circuit of the circuit board to be tested is confirmed as the circuit having a most number of times of being tested in the record of test data;
the record of test data is updated after each time of testing the circuit to be tested;
after each circuit is tested, a circuit having a most number of times of being tested is confirmed as the circuit to be tested next until the faulty region of the circuit board is determined or until there are no more circuits to be tested.

2. The circuit board testing device of claim 1, wherein the measurement parameters of the measurement gauge comprise a serial port configuration and a voltage measurement configuration.

3. The circuit board testing device of claim 1, wherein the measurement rules comprise a test information selection configuration, a measurement delay configuration, and a measurement value input method configuration.

4. The circuit board testing device of claim 1, wherein the processor controls the measurement gauge to measure a voltage between a signal line and a ground terminal of the circuit and measure a voltage between two signal lines, a resistance of the signal lines, and a differential voltage of a diode of the signal lines.

5. The circuit board testing device of claim 1, wherein:
the processor performs K-means clustering on recorded voltage measurement values to generate K measurement ranges;
each time the measurement gauge completes a voltage measurement, the processor selects a measurement range including the voltage measurement and confirms a recorded voltage measurement value within the measurement range as a reference value, and then the processor controls the measurement gauge to measure the voltage of the circuit to be tested next to determine the faulty region of the circuit board.

6. A method for testing a circuit board implementable in a circuit board testing device electrically coupled to a measurement gauge and comprising:
configuring, before testing the circuit board, measurement parameters of the measurement gauge;
configuring measurement rules for testing the circuit board;
confirming a circuit of the circuit board to be tested according to a record of test data stored in a memory of the circuit board testing device;
controlling the measurement gauge to test the circuit of the circuit board to be tested when the measurement gauge is electrically coupled to the circuit of the circuit board to be tested;
receiving measurement data from the measurement gauge; and
analyzing a faulty region of the circuit board according to the record of test data and the measurement data;
wherein the record of test data comprises at least a plurality of circuits of the circuit board tested during each time of testing the circuit board and a corresponding voltage value of each circuit of the circuit board;
the circuit of the circuit board to be tested is confirmed as the circuit having a most number of times of being tested in the record of test data;
the record of test data is updated after each time of testing the circuit;
after the circuit is tested, a circuit having a most number of times of being tested is confirmed as the circuit to be tested next until the faulty region of the circuit board is determined or until there are no more circuits to be tested.

7. The method of claim 6, wherein the controlling of the measurement gauge to test the circuit of the circuit board to be tested when the measurement gauge is electrically coupled to the circuit of the circuit board to be tested comprises:
controlling the measurement gauge to measure a voltage between a signal line and a ground terminal of the circuit and measure a voltage between two signal lines, a resistance of the signal lines, and a differential voltage of a diode of the signal lines.

8. The method of claim 7, wherein the analyzing of a faulty region of the circuit board according to the record of test data and the measurement data comprises:
performing K-means clustering on recorded voltage measurement values to generate K measurement ranges;
each time the measurement gauge completes a voltage measurement, selecting a measurement range including the voltage measurement and confirming a recorded voltage measurement value within the measurement range as a reference value, and then controlling the measurement gauge to measure the voltage of the circuit to be tested next to determine the faulty region of the circuit board.

9. The method of claim 6, wherein the measurement parameters of the measurement gauge comprise a serial port configuration and a voltage measurement configuration.

10. The method of claim 6, wherein the measurement rules comprise a test information selection configuration, a measurement delay configuration, and a measurement value input method configuration.

* * * * *